United States Patent [19]
Stribel

[11] Patent Number: 5,513,077
[45] Date of Patent: Apr. 30, 1996

[54] POWER DISTRIBUTION CENTER FOR MOTOR VEHICLE, PROVIDED WITH PRINTED CIRCUIT BOARDS, PRINTED CIRCUIT WEBS AND INTERMEDIATE INSULATIONS ARRANGED IN LAYERS

[75] Inventor: Hans P. Stribel, Nürtingen, Germany

[73] Assignee: Stribe GmbH, Nuertingen, Germany

[21] Appl. No.: 172,886

[22] Filed: Dec. 23, 1993

[30] Foreign Application Priority Data

Dec. 24, 1992 [DE] Germany .................. 42 44 064.5

[51] Int. Cl.⁶ .................. H05K 1/11; H01B 1/14; H01R 23/68; H01R 23/70
[52] U.S. Cl. .................. 361/794; 174/72 B; 361/790; 361/795; 361/803; 361/822; 361/826; 439/44; 439/47; 439/74
[58] Field of Search .................. 174/70 B, 71 B, 174/72 A, 72 B, 255; 361/775, 789, 790, 792–795, 826, 803, 728, 733, 772, 774, 775, 777, 778, 779, 780, 784, 790, 791, 789, 736, 822, 826; 439/76, 403, 34, 402, 404, 405, 43, 49, 189; 435/76, 403, 34, 402, 404, 405, 43, 49, 45, 189

[56] References Cited

U.S. PATENT DOCUMENTS

| | | | |
|---|---|---|---|
| 4,208,080 | 6/1980 | Teagno | 439/45 |
| 4,684,765 | 8/1987 | Beck et al. | 361/775 |
| 4,689,718 | 8/1987 | Maue et al. | 361/736 |
| 4,991,285 | 2/1991 | Shaheen et al. | 361/784 |
| 5,011,417 | 4/1991 | Matsumoto et al. | 361/775 |
| 5,023,752 | 6/1991 | Detter et al. | 361/750 |
| 5,207,587 | 5/1993 | Hamill et al. | 361/826 |
| 5,229,922 | 7/1993 | Muramatsu et al. | 361/736 |
| 5,343,359 | 8/1994 | Morton et al. | 361/784 |

FOREIGN PATENT DOCUMENTS

| | | | |
|---|---|---|---|
| 3439410 | 4/1986 | Germany . | |
| 2-74114 | 3/1990 | Japan | 174/72 B |
| 2-74113 | 3/1990 | Japan | 174/72 B |

*Primary Examiner*—Donald A. Sparks
*Attorney, Agent, or Firm*—Michael J. Striker

[57] ABSTRACT

An arrangement for a motor vehicle for central connection of electrical components, the arrangement comprises a housing, a plurality of supply circuits and control circuits, a plurality of circuit straps punched out of metal sheets and printed circuit boards, the supply circuits and the control circuits being formed so that the supply circuits are formed exclusively from the punched circuit straps and the control circuits are formed exclusively from the printed circuit boards, the printed circuit boards with the punched circuit straps and their intermediate insulations being assembled in a plurality of layers in a substantially identical surface configuration to form a printed circuit pack.

11 Claims, 1 Drawing Sheet

F I G. I
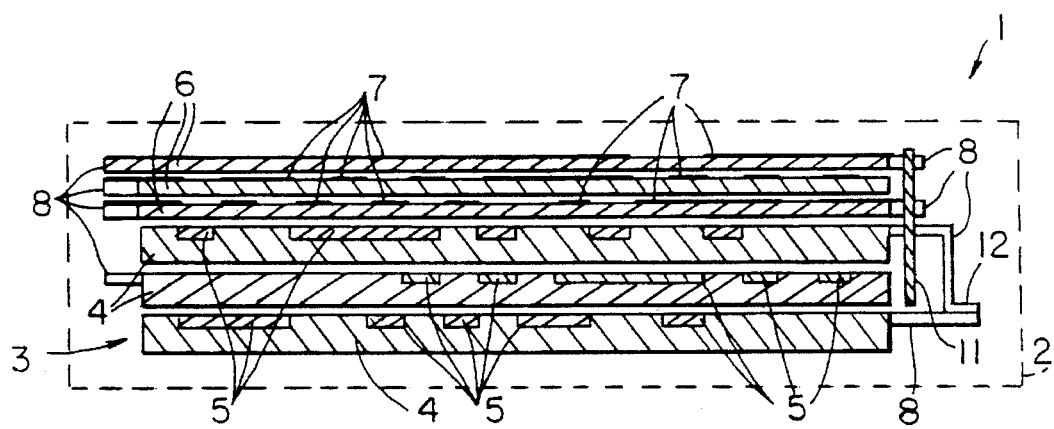
F I G. 2
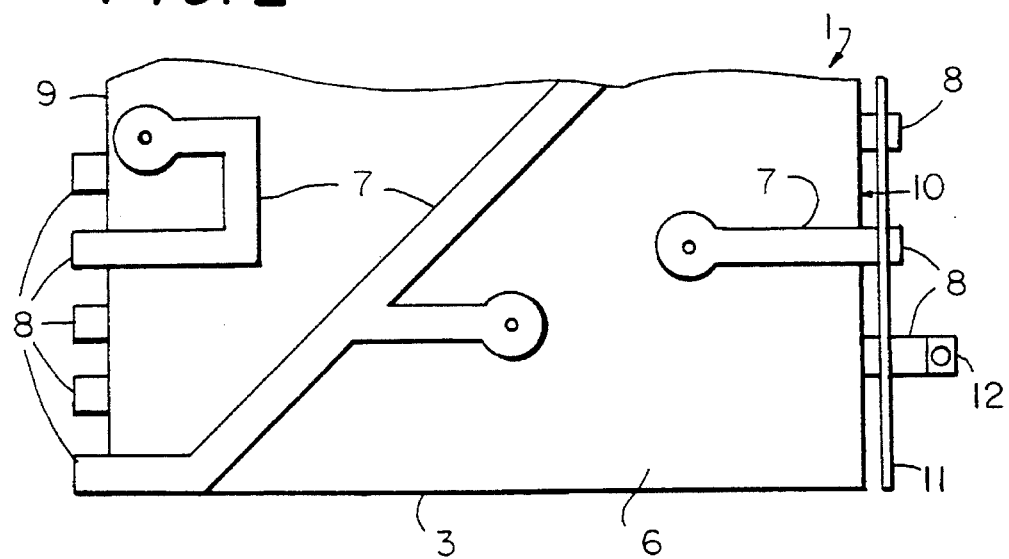

5,513,077

POWER DISTRIBUTION CENTER FOR MOTOR VEHICLE, PROVIDED WITH PRINTED CIRCUIT BOARDS, PRINTED CIRCUIT WEBS AND INTERMEDIATE INSULATIONS ARRANGED IN LAYERS

BACKGROUND OF THE INVENTION

The present invention relates generally to arrangements for vehicles, and in particular to arrangements for central connection of electrical components of a motor vehicle with supply and control circuits provided in a housing.

Arrangements of the above mentioned general type are known. One of such arrangements is disclosed in the German document DE 3,439,410 A1. The arrangement disclosed in this document has a synthetic plastic housing, in which circuit straps (stamped circuit straps) stamped from metal plates are arranged over one another in different planes for forming supply and control circuits. The stamped circuit straps can be separated from one another by intermediate insulation. Moreover, a microcomputer is provided in an upper chamber of the housing, and its components such as a microprocessor, a program memory, and input and output units can be arranged on a printed circuit board. It is believed that this arrangement can be further improved.

SUMMARY OF THE INVENTION

Accordingly, it is an object of the present invention to provide an arrangement of the above mentioned general type which is further modified so that the control and supply circuits can be formed with simple means, the tool costs can be reduced, and also reduction of manufacturing expenses is obtained.

In keeping with these objects and with others which will become apparent hereinafter, one feature of the present invention resides, briefly stated, in an arrangement for a vehicle, in which the supply and control circuits are formed separately and arranged separately from one another so that the supply circuits are produced exclusively on the stamped circuit straps (stamped circuit straps), and for the control circuits exclusively such printed circuit boards are provided which together with the stamped circuit straps and their intermediate insulations are arranged with a substantially same surface configuration in a layered structure in different planes as a pack regularly or irregularly relative to one another.

When the arrangement is designed in accordance with the present invention, it provides for the above mentioned advantages.

In accordance with a further feature of the present invention, the control circuits of the printed circuit boards are formed as printed circuit strips or thin metal foils.

The control circuits and/or the supply circuits can be selectively connectable with one another. The connection of the circuits at one or several sides of the printed circuit pack can be provided transversely to the layer plane. The connection of the circuits can be plugged, riveted, or soldered or performed in another technically identical galvanic contacting technique. The connection of the circuits can be formed as printed circuit board parts, a flat band cable, or a metal foil conductor.

The supply and control circuits can be provided at the edge on the printed circuit pack with extending connecting parts for the connection. The metal foil conductor of the control circuits at the edge of the printed circuit pack can be bent at least in a further layer plane.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 1 is a view showing an arrangement in accordance with the present invention with a plurality of stamped circuit straps, intermediate insulation and printed circuit boards arranged in different planes; and FIG. 2 is a plan view of the arrangement in accordance with the present invention of FIG. 1.

DESCRIPTION OF THE PREFERRED EMBODIMENTS

An arrangement in accordance with the present invention is identified as a whole with reference numeral 1 and can be used for central connection of electrical components in a motor vehicle. A plurality of electrical supply and control circuits, for example for blinking lights, lamps, windshield wipers, magnetic valves and other components can be centrally assembled with one another.

The arrangement 1 is provided with a housing 2 which is shown in broken line and composed of a synthetic plastic material. The housing 2 encloses a printed circuit pack 3 formed of a plurality of planes arranged over one another. The printed circuit pack 3 can be composed for example of one or several, and preferably three, insulation plates 4 with stamped circuit straps 5 located in recesses or grooves, and one or several, and preferably three, printed circuit boards 6 with conductor strips 7 which are printed or can be produced of laminated thin metal foils.

The printed circuit pack 3 has different circuits which in accordance with the present invention are formed so that the conductor strips 7 of the three printed circuit boards which are thin and have a relatively small conductor cross-section form exclusively the different control circuits for the electrical components, while the stamped circuit straps 5 which are thick and have a relatively great conductor cross-section in the planes under the insulation plates 4 are formed exclusively as supply circuits for the electrical components. Therefore the printed circuit boards 6 which form exclusively the control circuits and the stamped circuit straps 5 with the insulation plates 4 which form exclusively the supply circuits are arranged in different parallel planes with a substantially identical surface configuration over one another so that the printed circuit pack 3 in all planes is substantially identical. Thereby a small size compact structural unit is provided, which preferably can be formed as a substantially rectangular multi-layer pack.

In order to selectively connect the control circuits and/or the supply circuits of the arrangement 1 with one another, it is advantageous when connecting parts 8 are formed on the printed circuit straps 5 and the printed circuit boards 6 with the conductor strips 7. The connecting parts 8 can extend at least at one edge 9, 10 and preferably at opposite sides of the pack. The connection of the circuits can be provided correspondingly at one or several sides of the printed circuit pack 3 and preferably formed by printed circuit parts 11 or flat band cables which can preferably include a plurality of individual conductors located parallel in a single plane. The connection of the circuits preferably can be formed so that for example the printed circuit board part 11 is arranged at a small distance close to the printed circuit pack 3 transversely to its layer planes. The electrical contacting can be performed for example by soldering or plug or rivet connection 12 shown in FIG. 1, or by another similar galvanic connection. When the control circuits of the printed circuit board-conductor strips 7 are formed of metal foil conductors, it can be advantageous to form the latter so that they are bendable on the edge 9, 10 of the printed circuit pack 3 in at least one further printed circuit board-layer plane approximately about 180 degree. As a result, special additional current connections can be dispensed with.

A substantial advantage of the inventive arrangement is that the circuits operate clearly separately. In particular, the stamped circuit straps 5 punched of metal sheets perform only the functions of the supply circuits, while the functions of clearly separate control circuits are performed by the conductor strips 7 of the printed circuit boards 8. Thereby a low cost manufacture and high operational safety are provided. The control circuits can be produced in a simple, reproducible and technically high quality manner by known printed technique process, and it is possible to provide conductor trains punched from the metal sheets. The printed circuit-board-control circuits have due to reliable and simple manufacturing possibilities in contrast to punched circuit straps, which for example can be bent, practically no fault. Moreover, the control circuits on the printed circuit boards can be simply and reliably tested before the assembly of the printed circuit pack, so that occasional errors can be timely recognized and removed. The punched circuit straps 5 of the supply circuits can be tested after the assembly of the printed circuit pack 3 as to their operability.

Moreover, a further reduction of the manufacturing costs is obtained since for the control circuits of the inventive arrangement 1 no special punching tools are needed. Therefore a technically very reliable and extremely cost favorable arrangement 1 can be produced.

In order to provide a preferable and uncomplicated connection of the circuits with one another, it is advantageous to arrange the control circuits and the supply circuits when needed in different planes in association with one another. The stamped circuit boards 6 and the printed circuit straps 5 with the intermediate layers 4 can be arranged in layers over one another in selectively regular and irregular sequence relative to one another when needed.

It will be understood that each of the elements described above, or two or more together, may also find a useful application in other types of constructions differing from the types described above.

While the invention has been illustrated and described as embodied in an arrangement for a vehicle, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

I claim:

1. An arrangement for a motor vehicle for central connection of electrical components, the arrangement comprising a housing; a plurality of supply circuits and control circuits; a plurality of printed circuit webs and printed circuit boards, said supply circuits and said control circuits being formed so that said supply circuits are formed exclusively from said printed circuit webs and said control circuits are formed exclusively from said printed circuit boards, said printed circuit boards together with said printed circuit webs, and their intermediate insulations being assembled in a plurality of layers in a substantially identical surface configuration to form a printed circuit pack, said printed circuit boards and said printed circuit webs with said intermediate insulations being arranged in different planes in layers which are located irregularly relative to one another.

2. An arrangement as defined in claim 1, wherein said control circuits of said printed circuit boards are formed as printed conductor strips.

3. An arrangement as defined in claim 1, wherein said control circuits of said printed circuit boards are formed as thin metal foils.

4. An arrangement as defined in claim 1, wherein at least some of said circuits are selectively connectable with one another.

5. An arrangement as defined in claim 4, wherein said control circuits are selectively connectable with one another.

6. An arrangement as defined in claim 4, wherein said supply circuits are selectively connectable with one another.

7. An arrangement as defined in claim 4; and further comprising means for connecting at least some of said circuits with one another at least at one side of said printed circuit pack transversely to a plane of its layers.

8. An arrangement as defined in claim 7, wherein said connecting means are formed as riveting means.

9. An arrangement as defined in claim 7, wherein said supply circuits and said control circuits are provided with connection parts extending beyond an edge of said printed circuit pack connectable with one another by said connecting means.

10. An arrangement as defined in claim 4; and further comprising means for connecting at least some of said circuits with one another at least at several sides of said printed circuit pack transversely to a plane of its layers.

11. An arrangement as defined in claim 1, wherein said control circuits are provided with metal foil conductors at at least one edge of said printed circuit board pack and bendable in at least one further plane.

\* \* \* \* \*